United States Patent
Faber

(10) Patent No.: US 7,362,452 B2
(45) Date of Patent: Apr. 22, 2008

(54) METHOD OF ADJUSTING THE OPERATING REGION OF A TOOL COMPONENT TO A PRE-DETERMINED ELEMENT

(75) Inventor: Jacob Simon Faber, Eindhoven (NL)

(73) Assignee: FEI Company, Hillsboro, OR (US)

( * ) Notice: Subject to any disclaimer, the term of this patent is extended or adjusted under 35 U.S.C. 154(b) by 71 days.

(21) Appl. No.: 11/522,832

(22) Filed: Sep. 18, 2006

(65) Prior Publication Data

US 2007/0075271 A1    Apr. 5, 2007

(30) Foreign Application Priority Data

Sep. 19, 2005  (NL) .................................... 1029982

(51) Int. Cl.
*G01B 11/14* (2006.01)
(52) U.S. Cl. .................................... 356/616
(58) Field of Classification Search ............... 356/616; 250/559.29
See application file for complete search history.

(56) References Cited

U.S. PATENT DOCUMENTS

| 5,977,539 | A | * | 11/1999 | Holzapfel et al. ...... 250/237 G |
| 6,566,654 | B1 | | 5/2003 | Funatsu et al. |
| 2003/0184768 | A1 | * | 10/2003 | Fujishima et al. .......... 356/614 |

FOREIGN PATENT DOCUMENTS

JP    5290787    11/1993

OTHER PUBLICATIONS

Tan H W et al., "Automatic Integrated Circuit Die Positioning in the Scanning Electron Microscope," Scanning Foundation for Advances in Medicine and Science, Scanning, vol. 24, 86-91 (2002).

\* cited by examiner

*Primary Examiner*—Roy M Punnoose
(74) *Attorney, Agent, or Firm*—Scheinberg & Griner, LLP; Michael O. Scheinberg

(57) ABSTRACT

The invention describes a method of positioning an image field of, for example, an electron microscope at a specific structure in a regular grid of nominally identical structures. Such structures can, for example, be memory cells on a chip. Such memory cells nowadays have an area of, for example, less than 1 $\mu m^2$, and are arranged in a grid of 1000*1000 cells. During displacement, an error can occur that is larger than a grid distance of the structures, as a result of which the image field is adjusted to a structure other than the intended one. The displacement can be sub-divided into a large number of component displacements, whereby the error per component displacement is smaller than half a grid distance. By now determining the displacement after each component displacement, the error per component displacement can be eliminated. This method lends itself to automation, whereby the image displacements are determined with the aid of correlation techniques.

12 Claims, 4 Drawing Sheets

METHOD OF ADJUSTING THE OPERATING REGION OF A TOOL COMPONENT TO A PRE-DETERMINED ELEMENT

BACKGROUND OF THE INVENTION

The invention relates to a method of positioning the operating region of a tool component at a pre-determined, random grid element in a nominally regular grid of nominally identical grid elements, whereby the positioning occurs with the aid of an adjusting mechanism, comprising the steps of:

a. finding an initial position reference in the grid;
b. performing a displacement of the tool component with respect to the grid;
c. subsequently finding a position reference in the grid;
d. testing if the pre-determined grid element is within a pre-determined distance of the operating region of the tool component, and;
e. depending upon the result of the test, repeating step b, and, if necessary, repeating steps c and d.

The invention also relates to an apparatus for performing the method according to the invention.

Such a method is employed, for example, in the semiconductor industry in defect analysis, where there is a desire to inspect a specific element, such as a memory cell, in a grid of nominally identical memory cells in a semiconductor circuit, with the aid of, for example, a Scanning Electron Microscope (SEM). Such a semiconductor circuit can already be broken out of a wafer, or it can still constitute a part of the wafer.

In the case of a SEM, a focused electron beam inspects a sample, such as a semiconductor circuit. At the location where the electron beam impinges upon the sample, secondary electrons inter alia are emitted, which are detected using a Secondary Electron Detector (SED). In this manner, (position-dependent) information is obtained, which is subsequently made available in the form of an image. The size of the focus of a SEM is nowadays 1 nm, for example, so that images with a very high resolution can be made herewith.

In the semiconductor industry, so-called wafers with a cross-section of, for example, 30 cm are processed into ICs. At a certain point, a wafer is broken up into tens or even hundreds of ICs, whereby countless semiconductor elements are present on each IC. These semiconductor elements often form grids of nominally identical structures on such an IC, as is, for example, the situation in the case of semiconductor elements in the form of memory cells. So as to reduce production loss, it may be desirable to inspect specific semiconductor elements.

The desire to inspect a specific element, such as a specific memory cell, can arise, for example, from an electrical test, in which it transpires that the properties of the element concerned deviate from the specifications of other elements. By inspecting such a specific element, one can obtain insight as to the cause of the deviation, which can lead to process and/or production improvements and, accordingly, to reduced production loss.

Memory cells such as used nowadays in the semiconductor industry often occupy an area of less than a square micron, and are organized into grids, in which, for example, 1000*1000 memory cells are arranged. So as to be able to inspect a specific memory cell, e.g. with a SEM, the operating region of the SEM (the image field) will have to be displaced to this specific memory cell. To this end, it is first necessary to locate an easily recognizable point, such as a corner point of the grid, after which one can displace to the memory cell to be inspected.

In the method described above, an image of the semiconductor circuit as made available by the SEM is continuously depicted on a display. The semiconductor circuit, which is mounted on a moving mechanism such as an x-y table, can be displaced using a joystick, for example. First, the image field is displaced to a grid element at a known position, such as a corner point of the grid. From this known position, one knows in advance by how many rows and columns one has to displace so as to arrive at the element to be inspected. Subsequently, the semiconductor circuit is displaced with the aid of the joystick, whereby the displacement of the semiconductor circuit on the display is simultaneously followed by eye. By now counting—during displacement—by how many rows and columns the image displaces across the semiconductor circuit, the pre-determined position is eventually reached.

A disadvantage of the known method is that there is a great risk of counting errors, e.g. as a result of interruptions or disturbances in concentration of the personnel performing the method. A counting error can easily be made, or one can loose count, after which the whole process will have to be performed anew. One must realize in this context that the movement of the x-y table at this magnification, whereby elements of less than 1 $\mu m^2$ are imaged, occurs in a relatively abrupt manner.

It should be noted that the elements do not necessarily have to be ordered in a rectangular grid, but that this can also be a skewed grid or, for example, a grid in the form of a honeycomb. Such grid forms increase the risk of counting errors.

SUMMARY OF THE INVENTION

It is an object of the invention to provide a method whereby the risk of counting errors is smaller than what is achieved in the case of the described methods.

To this end, the method according to the invention is characterized in that:
the displacement takes the form of a displacement jump;
a maximum jump size is determined on the basis of:
the positional uncertainty of the displacing mechanism expressed in units of the grid period and/or,
the uncertainty in the periodicity of the grid expressed in units of the grid period, and;
the displacement jump is chosen to be smaller than the maximum jump size.

The invention is based upon the insight that, after a displacement jump, the position of a grid element can be determined with an accuracy much smaller than the grid distance between the grid elements. As a result, the uncertainty in the jump size can be eliminated after each displacement jump. However, no distinction can be made between one grid element and a nominally identical grid element that is located at a whole number of grid distances therefrom. It is therefore necessary, after a jump, to know which grid element, in the grid of nominally identical grid elements, has to have its position determined.

The uncertainty in the displacement performed by the adjusting mechanism is generally dependent upon the jump size. By now choosing the jump size such that the uncertainty in the jump size is less than half a grid distance, confusion cannot occur as to which grid element has to have its position determined. By dividing the displacement from the known position to the position of a pre-determined grid element into jumps of such a size that the uncertainty in the jump size is less than half the grid distance, and by eliminating the uncertainty in the jump after every jump, the tool component will hereby eventually be adjusted to the pre-determined grid element.

It should be noted that the uncertainty can be caused by an uncertainty in the moving mechanism, but that such an error can also be caused by an irregularity in the periodicity of the grid.

It should also be noted that it is not necessary that the uncertainty in the jump size be the same in different directions. This is because the uncertainty in the displacing mechanism (such as a mechanical displacing table) can be different in different directions. In addition, the periodicity of the grid can differ in different directions, which yields a different maximum jump size for different directions.

In an embodiment of the method according to the invention, the position reference is found with the aid of correlation techniques.

In those instances in which the tool component is used, for example, in image-forming techniques, the shift of two images can be determined with the aid of, for example, cross-correlation. This is a technique known per se. Cross-correlation can therefore be employed to determine the shift of two images—one recorded before and the other recorded after a displacement jump. This shift is composed of an expected component, resulting from the displacement jump, and a random component, resulting from the uncertainty in the displacement jump. It is thus possible to determine the random component, and to subsequently eliminate the effect hereof.

It should be noted that the shift of the images is not necessarily equal to the jump size: the image shift is, for example, nominally equal to zero (the recordings are nominally identical) when the displacement is a whole number of grid distances.

It should also be noted that the term "image" can not only be considered as referring to a flat image (2D), but also to a spatial image (3D).

An advantage of the use of correlation techniques is that the method can be performed in an automated manner, which leads to a further reduction of the risk of counting errors, and leads to a reduction in personnel costs.

Another advantage of the use of correlation techniques is that one hereby uses the information from the entire image from, for example, a SEM, which makes it possible to make a good determination of the shift, and thereby also a good determination of the jump size, even in the case of poor signal-to-noise ratios.

An additional advantage of the use of correlation techniques is that these also allow a good determination of the shift in the case of grid elements that are not entirely identical to one another, e.g. as a result of damage to some grid elements, or because grid elements are (partially) invisible, e.g. because dust particles are located thereon. This also leads to a further reduction of the risk of counting errors.

It should be noted that in "Automatic IC Die Positioning in the SEM", H. W. Tan et al., Proceedings of the 26th International Symposium on Testing and Failure Analysis, 12-16 Nov. 2000, Bellevue, Wash., pages 469-476, a description is given of a method of automatically positioning the image plane of a SEM on a semiconductor circuit. In particular, on page 473, right hand column, an elucidation is given of a method to achieve this in the case of a regular grid of grid elements. In this case, for a first semiconductor circuit, a movement is first made from an initial position to a position to be investigated, after which a movement is made back to the initial position. During this movement back, a series of recordings is made. If now, for another semiconductor circuit, one positions at a nominally identical initial position, and, subsequently, using image recognition techniques, after every jump, one compares the recorded image with one of the series of previously recorded images, one can eliminate the positional uncertainty after every jump, and one can reproduce the path that is traveled on the first semiconductor circuit.

The method of Tan et al. is thus suited to reproduce a displacement, such as was previously realized on a first semiconductor circuit, on other semiconductor circuits, but it does not offer a solution to the problem of the invention, i.e. positioning at a randomly chosen, pre-determined grid element.

In another embodiment of the method according to the invention, the position reference is found with the aid of a particle beam.

In order to inspect elements with a maximum dimension of a few microns or less, a resolution of much less than 1 μm is desired. Such a resolution cannot be obtained with an optical microscope. However, in the case of a SEM, for example, which employs a focused beam of electrons, the size of the focus is much smaller than 1 μm, e.g. 1 nm. As a result, an image can be formed with a resolution of, for example, one or a few nm.

It should be noted that it is not necessary that the beam be a focused beam. In, for example, a Transmission Electron Microscope (TEM), a sample is often illuminated with a beam that, by approximation, is parallel-incident, whereby a shadow image of the sample is made.

In a further embodiment of the method according to the invention, the displacing mechanism causes a deflection of the particle beam.

Instead of, for example, a mechanical displacement of the image field with respect to the grid of elements, a non-mechanical displacement can also be applied. When using particle beams, such as electron beams and ion beams, the image field can be displaced by deflecting the particle beam with the aid of electric and/or magnetic fields.

In yet another embodiment of the method according to the invention, the tool component is a Scanning Probe Microscope (SPM).

Scanning Probe Microscopes, such as Scanning Tunneling Microscopes, Atomic Force Microscopes, Magnetic Force Microscopes, Electrostatic Force Microscopes, Scanning Near-Field Optical Microscopes, etc., are able to render visible very small details, down to details of atomic dimensions. The method according to the invention is very suited to displacing the image field of such a Scanning Probe Microscope through a pre-determined number of grid distances.

In yet a further embodiment of the method according to the invention, the grid is a grid of patterns on a semiconductor circuit.

Semiconductor circuits as used in the semiconductor industry often demonstrate regular grids of microscopically small elements. In order to inspect such grids, an element in such a grid will have to be localized with an accuracy of better than 1 μm, for example. The current expectation is that dimensions of structures on semiconductor circuits will only decrease in the future, and that the numbers of elements will only increase. As a result, the relative inaccuracy of the displacing mechanism (e.g. a moving table) with respect to the size of an element will only increase. This makes it very attractive to apply the method according to the invention in the case of such circuits.

In yet another embodiment of the method according to the invention, the position reference is found with the aid of electromagnetic radiation.

The tool component can be a light-optical microscope, but also, for example, a microscope that detects X-ray radiation (in a position-dependent manner).

It should be noted that, if the sample in which the grid is located is sufficiently transparent to the electromagnetic radiation that is employed, it is not only possible to determine a position reference in a 2-dimensional grid, but also in a 3-dimensional grid. It should further be noted that it is conceivable that a tool component irradiates an object with radiation of a certain type, but that radiation of another type is observed. In this context, one can, for example, consider fluorescence elements, which emit light in response to irradiation with, for example, X-ray radiation or irradiation with a particle beam, such as an electron beam. One can also consider the X-ray radiation that arises when a grid is irradiated with, for example, an electron beam.

In yet another embodiment of the method according to the invention, the position reference is found with the aid of sound.

The tool component can transmit and/or receive sound, such as ultrasonic sound, whereby, for example, an echography can be made. As an application, one can, for example, consider echography as used in the medical world (whereby the tool component both produces and detects ultrasonic sound), but also echography as applied in the oil industry for localizing oil fields, whereby the sound waves are generated by an explosion, for example.

In yet another embodiment of the method according to the invention, the position reference is found with the aid of magnetic resonance.

In the case of magnetic resonance, the sample to be investigated is put in a magnetic field, which magnetic field demonstrates a gradient. Subsequently, the sample is exposed to electromagnetic radiation with a specific frequency, which frequency is dependent on the magnetic field. In response hereto, the sample (particularly the hydrogen atoms, for example, in the sample) will absorb and subsequently re-emit the electromagnetic radiation, which, in the form of amplitude, frequency and/or phase, gives information regarding the sample.

When, now, the sample contains a grid of elements that can be detected using magnetic resonance, the image field of the tool component may be positioned w.r.t. this grid. The grid can hereby be a two-dimensional grid, but also a three-dimensional grid.

In yet another embodiment of the method according to the invention, the position reference is found during an uninterrupted movement of the operating region of the tool component w.r.t. the grid.

Repeatedly stopping and re-commencing the movement of a displacing mechanism after each jump costs time. By instead finding the position reference during an uninterrupted movement, time is saved.

It should be noted that, in the case of, for example, the recording of images for the purpose of finding the position reference, recording an image during a movement will cause a certain degree of image deformation. However, the consequences as regards determining the achieved displacement will be insignificant if a large degree of correlation occurs between the recordings that are compared. It is also possible to make both recordings at one-and-the-same displacement speed and direction, so that both recordings have the same image deformation. Another possibility is to compensate for the image deformation that occurs by manipulating one of the images.

BRIEF DESCRIPTION OF THE DRAWINGS

The invention will now be elucidated on the basis of figures, whereby identical reference numerals relate to corresponding structures. To this end.

DETAILED DESCRIPTION OF THE INVENTION

Figure 1A:
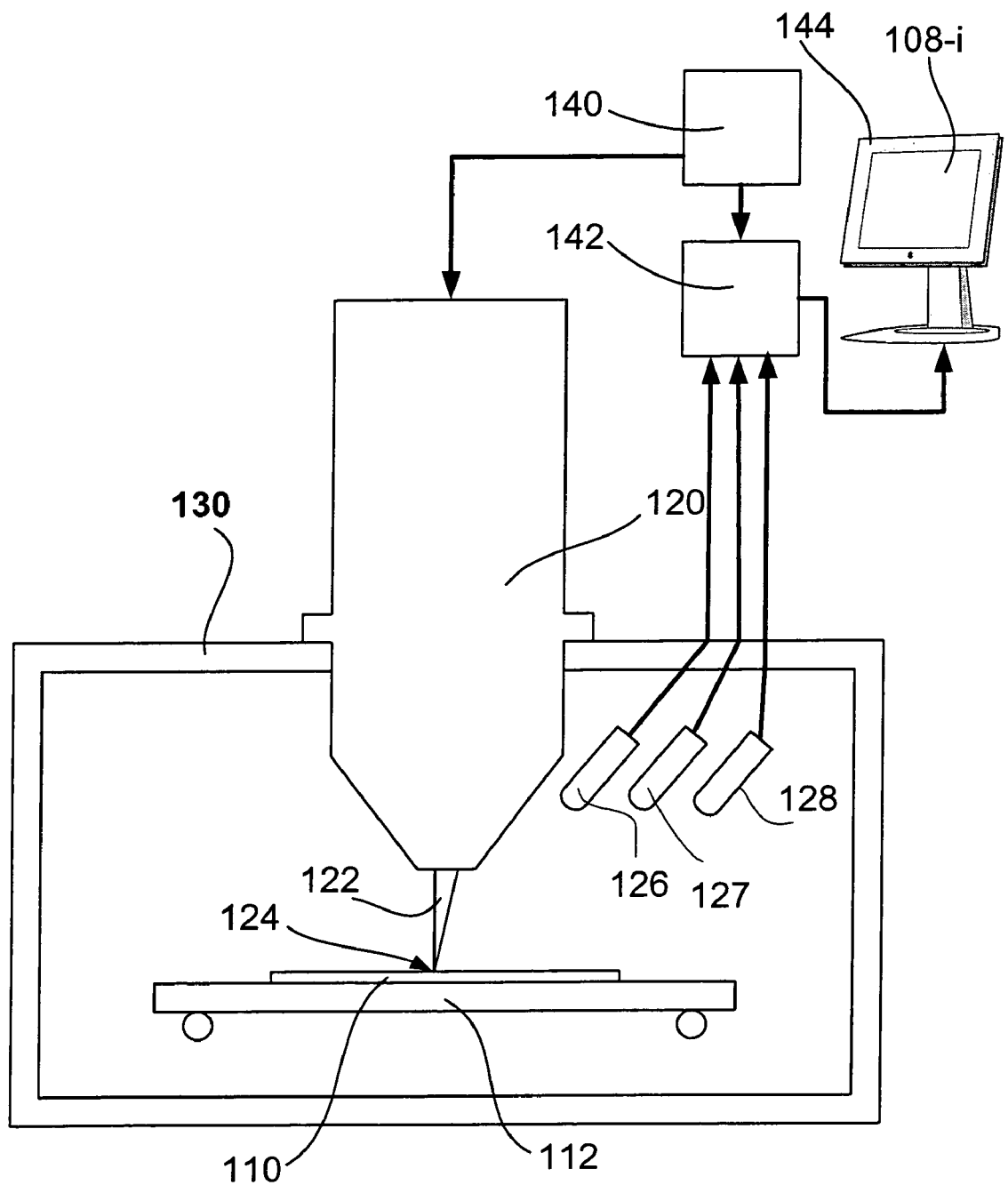
FIG. 1A schematically shows an apparatus for performing the method according to the invention.

FIG. 1A schematically shows an apparatus in the form of a SEM for performing the method according to the invention.

A sample to be analyzed, such as a semiconductor circuit 110, is located on a displacing mechanism in the form of an x-y table 112. The semiconductor circuit 110 is irradiated with a defocused electron beam 122 by a tool component in the form of an electron column 120. As a result of this irradiation, secondary electrons are released, which are detected by a secondary electron detector (SED) 126. X-ray radiation is also released, which is detected using detector 127, whereas detector 128 detects released light. The semiconductor circuit 110, the displacing mechanism 112 and the detectors 126, 127 and 128 are located in a vacuum chamber 130, which vacuum chamber is evacuated by (non-depicted) vacuum means. As is known to the skilled artisan, this evacuation is necessary so as to allow the electron column 120 and the SED 126 to function properly.

Because the focus 124 of the electron beam 122 is rastered across the semiconductor circuit 110 by the electron column 120 as controlled by a control unit 140, the detectors 126, 127 and 128 will detect position-dependent information from the semiconductor circuit 110. The information from one or more of the detectors 126, 127 and 128 is converted by an image processing unit 142 into an image 108-i—on monitor 144—of the image field of the electron column 120. In this manner, each recording made by the apparatus is rendered visible on this monitor 144.

It should be noted that it is, for example, also possible that the elements ordered in a regular grid be fluorescent markers, which are excited with the aid of the electron beam, as a result of which they emit light. Such markers can be nanocrystals of, for example, doped cadmium sulphide or cadmium selenide. By detecting the released light using detector 128, the apparatus according to FIG. 1 is suited to determining the position of such a marker with the resolution of the electron beam 122. This is because light will only be emitted when the electron beam is positioned on the marker and, as a result, the marker becomes excited. The elements ordered in a regular grid can also contain a material that emits an X-ray radiation characteristic of that material (detectable using detector 127), on the basis of which the position of these elements can be determined.

Figure 2A:
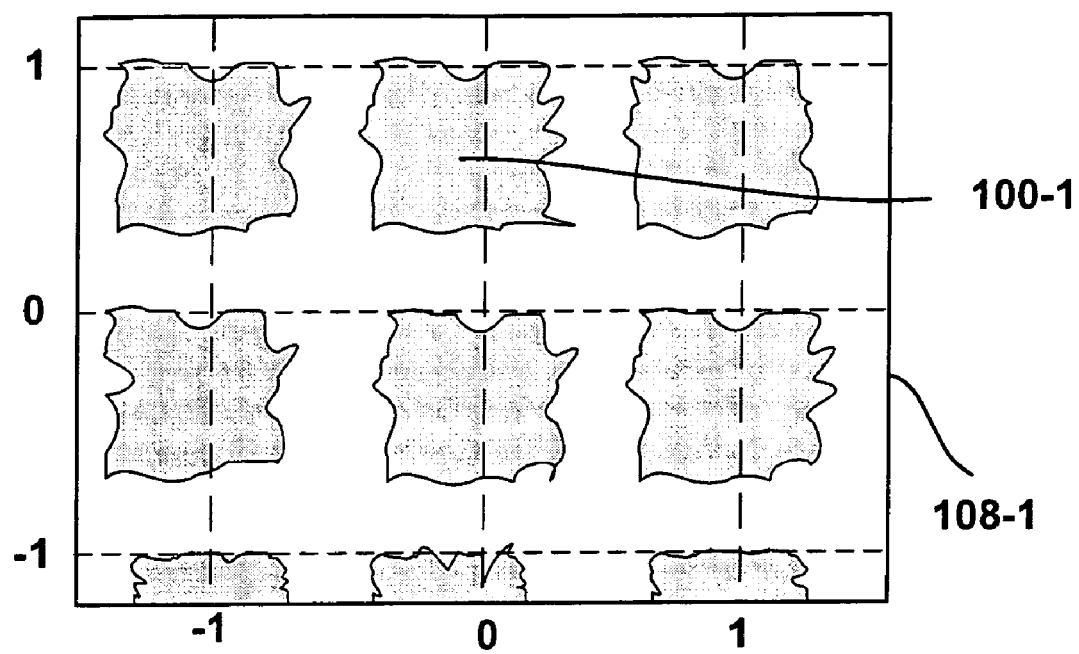
FIG. 2A schematically shows an image before a displacement jump is made.

FIG. 2A schematically shows a first image 108-i with structures. FIG. 2A also shows an orientation grid, which orientation grid has the period of the grid of structures. This orientation grid is not part of the regular structure, and can be considered as being mounted on the screen of monitor 144. Structure 100-1 is specially indicated here, so as to simplify identification in the next figure, FIG. 2B.

Figure 2B:
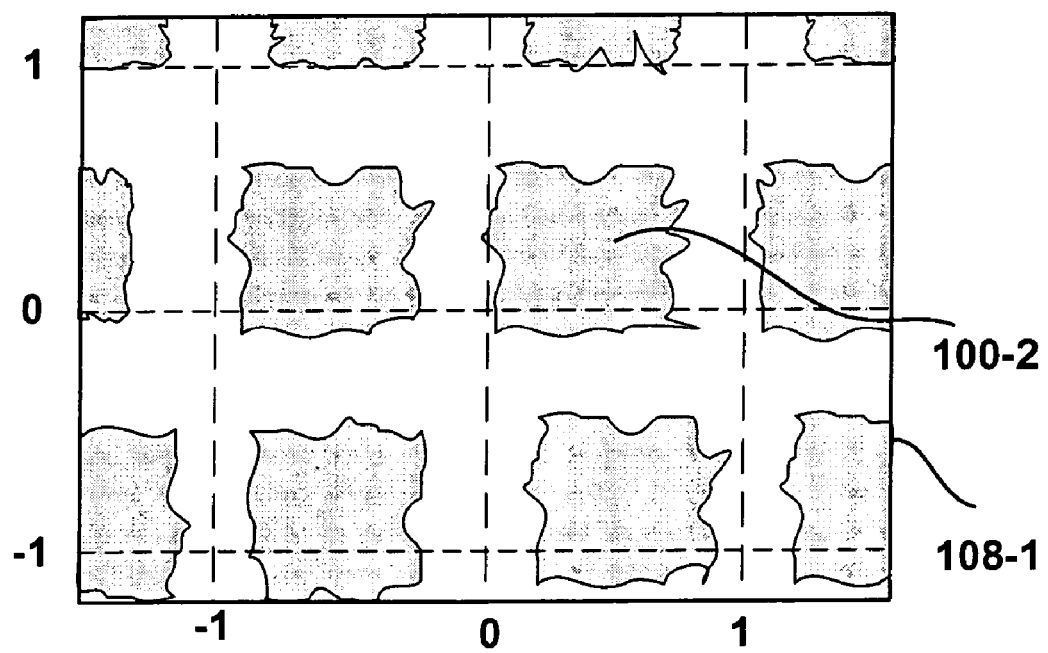
FIG. 2B schematically shows an image after a displacement jump is made.

FIG. 2B schematically shows a following image 108-2 with structures, after a desired displacement to the right through one grid distance. FIG. 2B also shows an orientation grid. This orientation grid is not part of the regular structure, and can be considered as being mounted on the screen of monitor 144. The following image 108-2 is shifted w.r.t. the image 108-1 as shown in FIG. 2A, but it can be clearly seen that the actual displacement does not correspond to the desired displacement to the right through one grid distance.

Figure 2C:
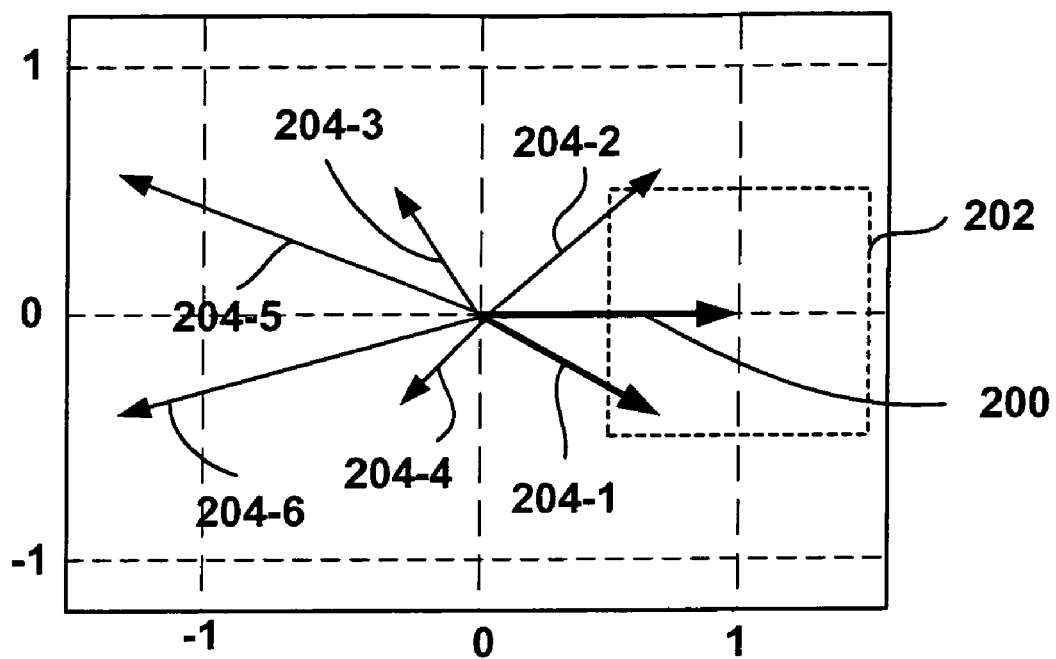
FIG. 2C schematically shows the desired and the realized image displacement of FIGS. 2A and 2B.

FIG. 2C schematically shows the desired and the realized displacement of FIG. 2A w.r.t. FIG. 2A. The desired displacement—one grid distance to the right—is indicated by displacement vector.200. Square 202 delineates the region where a realized displacement vector is to emerge, given an uncertainty in the displacement jump of less than half a grid distance. Because the grid is a grid of nominally identical structures, there are many possible displacements that yield a similar picture. A few of these displacements are indicated by the vectors 204-i. From these vectors, one must now select that displacement vector that depicts the actual shift. Because the structures are nominally identical, the correct vector cannot be found on the basis of the form of the structures. However, because it is known that the realized displacement vector must lie within the square 202, vector 204-1 indicates the realized displacement. It will be clear that only one displacement vector can end in the square 202.

By now determining the difference between vector 200 and vector 204-1, the effect of the uncertainty in the displacement jump can be eliminated.

Although, in the case of some structures, the position reference attendant to these structures can be determined in a simple manner, this cannot always be achieved in an easy manner. For example, problems can occur if it is not easy to determine a position reference on the structures because the structure is not sharply defined, if dust particles are located on the structures, if structures are damaged, etc. In these cases, the use of correlation techniques is attractive.

As is known to the skilled artisan in the field of correlation techniques, cross-correlation is an algorithm for determining the mutual shift of two images. In the case of cross-correlation, using different shifts of a first image—the so-called reference image—with respect to a second image, one determines the correspondence of grey values (grey levels) between this reference image and the second image. The values hereby determined (one value for each shift) can be stored in a memory and/or depicted in a third image, whereby the (grey) value of each point corresponds to the correlation value between the first and the second image for a given shift. It should be noted that, when the images have a finite size, as is often the case, the images will only partially overlap with each other when shifted. One can choose to only compare the overlapping portions of the two images. This, and corresponding techniques for dealing with the finiteness of the image fields, are referred to as "windowing", as is known to the skilled artisan.

Figure 2D:
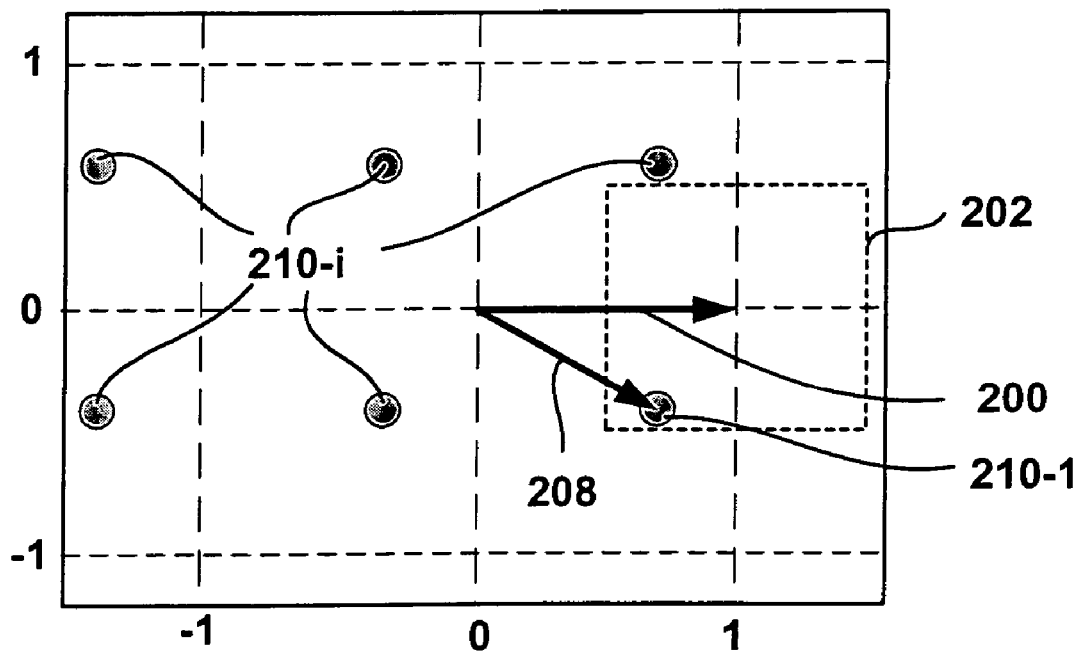
FIG. 2D schematically shows the cross-correlation pattern corresponding to FIG. 2C.

FIG. 2D schematically shows the cross-correlation pattern that is formed by comparing the images as depicted in FIGS. 2A and 2B. It shows six correlation peaks 210-i, being six mutual shifts of the images for which a high degree of correlation occurs. It should now be clear which of these correlation peaks should be used to determine the actual displacement. If the uncertainty is less than half a grid distance, the sought-after correlation peak should be located less than half a grid distance from the expected position 200, i.e. within the square 202. It is thus clear which of the correlation peaks depicts the actual displacement, and the actual displacement can be determined.

The correspondence between FIG. 2D and FIG. 2C should be clear: the correlation peaks of FIG. 2D indicate the end of the vectors 204-i of FIG. 2C.

It should be noted that, in determining the uncertainty, an error can occur. This error is, for example, caused by noise in the correlation patterns. It is conceivable that, when the uncertainty in the displacement jump is repeatedly eliminated by making a comparison between the two last position determinations, this will give rise to a cumulative error of more than half a grid distance. In this manner, it would still not be clear which grid element is the grid element to be investigated. However, by repeatedly comparing, for example, the last image to the first image, no cumulative error will occur. This is because, in this case, the expected shift and the realized shift are repeatedly determined w.r.t. the first image.

It should also be noted that the first image can be an image formed by, for example, the tool component, but that it can also be an image that is constructed from the design data of the elements, e.g. derived from a CAD (computer-aided design) plan.

A great advantage of the use of correlation techniques for this method is that, by using, for example, the first image as a reference image and by correlating this after every jump with the image that is recorded after that jump, the information of this entire reference image and the entire captured image serves as a position reference, without a specific characteristic of the structure having to be identified for this purpose.

An attendant advantage of correlation techniques is that the information from the entire image can be used, which makes application possible in the case of, for example, poor signal-to-noise ratio.

Another advantage is that good results are also achieved even when the elements are not entirely identical, for example because a dust particle lies on (a portion of) an element, or an element demonstrates damage.

It should be noted that it is not necessary that the sample be stationary during localization of the position reference. In particular, if acquisition of the image upon which, for example, the correlation techniques are applied happens so quickly that the displacement during this acquisition time is small with respect to the size of the operating region of the tool component or of the structures, the displacement can just continue and control of the adjusting means can be changed during movement. Even if a considerable shift occurs during the acquisition time, this can be compensated by, for example, a continual deflection of the particle beam during the acquisition. It is also possible to make a compensation in the image memory for the fact that there is a displacement during acquisition.

Experiments indicate that good results are achieved when the image with which the cross-correlation is performed contains, for example, 25 grid elements in a 5*5 grid. When an image is built up from these 5*5 elements, consisting, for example, of 256*256 image points, the actual size of the displacement jump can be determined tens of times per second with the aid of correlation techniques with a normal computer.

Figure 3:
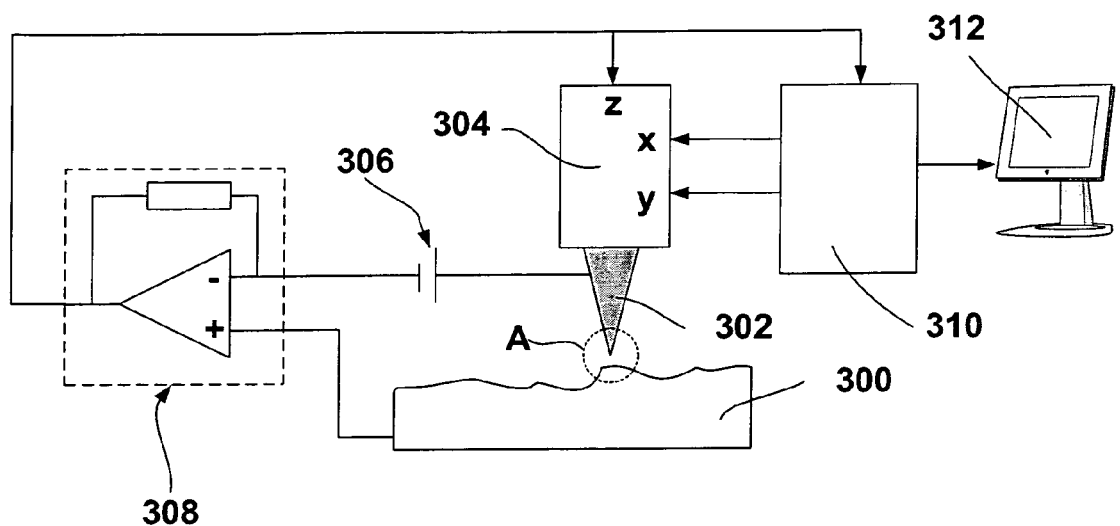
FIG. 3 schematically shows an STM.

FIG. 3 schematically shows an STM. In an STM, a probe in the form of a sharp needle 302 is moved by moving means 304 very closely over a surface 300 to be investigated. The distance from the needle 302 to the surface 300 is very small, e.g. smaller than 0.5 nm. Between the needle 302 and the surface 300 there is a voltage difference, caused by a voltage source 306, which voltage difference causes a tunneling current. This tunneling current is measured by current measurement means 308. The size of this tunneling current is strongly dependent upon the distance between the needle 302 and the surface 300. The moving means 304 consist in general of piezoelectric elements with which the needle can be moved both in a plane parallel to the surface 300 and perpendicular thereto. By feeding back the signal from the current measurement means 308 to the moving means 304, the needle 302 is maintained at an almost constant distance from the surface 300. When, now, the needle 302 is moved across the surface by the moving means 304, under control of a control unit 310, the needle will stay at an almost constant distance from the surface, as a result of which the control signal for the piezo-element responsible for movement perpendicular to the surface will give (position-dependent) height information regarding the surface 300. Because this height information is also passed to the control unit 310, this can depict an image on monitor 312, whereby, for example, different grey values represent different heights.

Figure 3A:
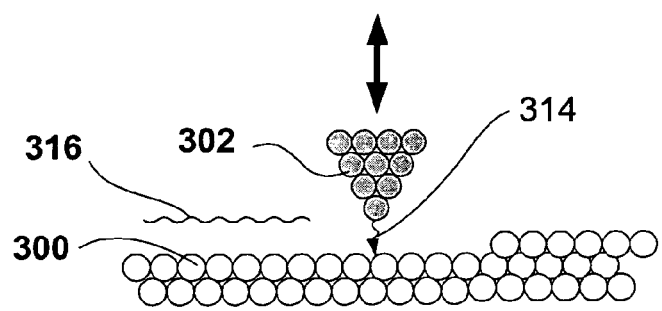
FIG. 3A shows an enlargement of region A of FIG. 3.

FIG. 3A schematically shows an enlargement of region A of FIG. 3. The extremity of the needle 302 is located at a tiny distance from the surface 300 to be investigated. A tunneling current 314 flows between the needle and the surface. The moving mechanism maintains the needle 302 at an almost constant distance from the surface, so that, in motion, the extremity of the needle 302 follows a path 316.

It should be clear that, with the aid of the obtained image, the position of a position reference can be determined. The method according to the invention can therefore be employed by determining a position reference within the operating region of the STM, subsequently increasing the distance to the surface to a safe distance (i.e. a distance at which the needle cannot touch the surface), then making a jump, reducing once again the distance between the needle and the surface, and seeking a position reference once again in the (displaced) operating region of the STM. This can be repeated until the desired position is reached.

An advantage of the method according to the invention is that the displacement speed of the needle during the jump can be chosen to be much higher than the displacement speed of the needle during rastering of the sample.

Although the use of the method according to the invention is elucidated in the case of an STM, it will be clear to the skilled artisan how to apply this method in the case of other Scanning Probe Microscopes. This is because, in all SPMs, a sharp probe is rastered across the surface so as to be very close to, or in contact with, this surface, and information concerning the sample is hereby obtained, which information can, for example, be depicted in the form of an image. By using the correct type of SPM, a particular type of position reference can be found, e.g. the location of a magnetic particle, or the location of a structure that is characterized by a deviating coefficient of friction.

From the preceding text, it will be clear to the skilled artisan how to apply the invention in the case of a random image-forming technique, e.g. microscopy with visible light or infrared, ultrasound techniques such as used nowadays, or techniques that make use of magnetic resonance.

From the above text, the skilled artisan will also be able to deduce how to use the invention for other position-determining techniques.

The invention claimed is:

1. A method of positioning the operating region of a tool component at a pre-determined, random grid element in a nominally regular grid of nominally identical grid elements, whereby the positioning occurs with the aid of an adjusting mechanism, comprising the steps of:
   a. finding an initial position reference in the grid;
   b. performing a displacement of the tool component with respect to the grid;
   c. subsequently finding a position reference in the grid;
   d. testing if the pre-determined grid element is within a pre-determined distance of the operating region of the tool component, and;
   e. depending upon the result of the test, repeating step b, and, if necessary, repeating steps c and d,
characterized in that:
   the displacement takes the form of a displacement jump;
   a maximum jump size is determined on the basis of:
      the positional uncertainty of the displacing mechanism expressed in units of the grid period or,
      the uncertainty in the periodicity of the grid expressed in units of the grid period, and;
   the displacement jump is chosen to be smaller than the maximum jump size.

2. A method according to claim 1 in which the position reference is found with the aid of correlation techniques.

3. An apparatus equipped with a control unit embodied to perform the method according to claim 2.

4. A method according to claim 1 in which the position reference is found with the aid of a particle beam.

5. A method according to claim 4 in which the displacing mechanism causes a deflection of the particle beam.

6. A method according to claim 4 in which the grid is a grid of patterns on a semiconductor circuit.

7. A method according to claim 1 in which the tool component is a Scanning Probe Microscope.

8. A method according to claim 1 in which the position reference is found with the aid of electromagnetic radiation.

9. A method according to claim 1 in which the position reference is found with the aid of sound.

10. A method according to claim 1 in which the position reference is found with the aid of magnetic resonance.

11. A method according to claim 1, in which the position reference is found during an uninterrupted movement of the tool component with respect to the grid.

12. The method according to claim 1, in which the maximum jump size is determined on the basis of the positional uncertainty of the displacing mechanism expressed in units of the grid period and the uncertainty in the periodicity of the grid expressed in units of the grid period.

* * * * *